United States Patent
Lee et al.

(10) Patent No.: US 9,673,383 B2
(45) Date of Patent: Jun. 6, 2017

(54) MULTILAYER CERAMIC ELECTRONIC COMPONENT AND METHOD OF MANUFACTURING THE SAME

(71) Applicant: SAMSUNG ELECTRO-MECHANICS CO., LTD., Suwon-Si, Gyeonggi-Do (KR)

(72) Inventors: Kyoung No Lee, Suwon-Si (KR); Kyu Ha Lee, Suwon-Si (KR); Eun Joo Choi, Suwon-Si (KR); Jun Hyeong Kim, Suwon-Si (KR); Byung Jun Jeon, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 100 days.

(21) Appl. No.: 14/723,448

(22) Filed: May 27, 2015

(65) Prior Publication Data

US 2016/0087189 A1 Mar. 24, 2016

(30) Foreign Application Priority Data

Sep. 24, 2014 (KR) .................. 10-2014-0127922

(51) Int. Cl.
*H01G 4/30* (2006.01)
*H01L 41/273* (2013.01)
*H01L 41/047* (2006.01)
*H01G 4/008* (2006.01)

(52) U.S. Cl.
CPC ......... *H01L 41/273* (2013.01); *H01G 4/0085* (2013.01); *H01G 4/30* (2013.01); *H01L 41/0471* (2013.01); *H01L 41/0472* (2013.01)

(58) Field of Classification Search
None
See application file for complete search history.

(56) References Cited

U.S. PATENT DOCUMENTS

| | | | |
|---|---|---|---|
| 2008/0210564 A1 | 9/2008 | Motoki et al. | |
| 2010/0302704 A1* | 12/2010 | Ogawa | H01G 4/30 361/306.3 |
| 2010/0328842 A1* | 12/2010 | Takeuchi | C23C 18/165 361/301.4 |
| 2010/0328843 A1* | 12/2010 | Saruban | H01G 4/2325 361/305 |

(Continued)

FOREIGN PATENT DOCUMENTS

| | | |
|---|---|---|
| KR | 10-2011-0072398 A | 6/2011 |
| KR | 10-2012-0068622 A | 6/2012 |
| WO | 2008/059666 A1 | 5/2008 |

*Primary Examiner* — Dion R Ferguson
(74) *Attorney, Agent, or Firm* — NSIP Law

(57) ABSTRACT

There is provided a multilayer ceramic electronic component including: a ceramic body in which internal electrodes containing a first electrode material and dielectric layers are alternately disposed; external electrodes provided on outer surfaces of the ceramic body and containing a second electrode material; and diffusion parts each disposed to be connected to one end of the internal electrode and the external electrode and containing the first electrode material and the second electrode material mixed with each other, wherein the diffusion part includes an internal diffusion portion disposed within the ceramic body and an external diffusion portion protruding outside of the ceramic body.

17 Claims, 5 Drawing Sheets

(56) References Cited

U.S. PATENT DOCUMENTS

2011/0149470 A1* 6/2011 Hur .................. H01G 4/005
  361/321.2
2011/0234045 A1* 9/2011 Motoki .............. H01G 4/005
  310/311
2012/0154977 A1 6/2012 Hur et al.

* cited by examiner

MULTILAYER CERAMIC ELECTRONIC COMPONENT AND METHOD OF MANUFACTURING THE SAME

CROSS-REFERENCE TO RELATED APPLICATION

This application claims the priority and benefit of Korean Patent Application No. 10-2014-0127922 filed on Sep. 24, 2014, with the Korean Intellectual Property Office, the disclosure of which is incorporated herein by reference.

BACKGROUND

The present disclosure relates to a multilayer ceramic electronic component and a method of manufacturing the same.

In general, electronic components using a ceramic material, such as a capacitor, an inductor, a piezoelectric element, a varistor, a thermistor, or the like, include a ceramic body formed of a ceramic material, internal electrodes formed in the ceramic body, and external electrodes installed on a surface of the ceramic body to be connected to the internal electrodes.

As various functions in fields requiring high reliability are digitalized and demands thereof are increased, high reliability is also required in the multilayer ceramic electronic component.

Resistance of the multilayer ceramic electronic component against external stress may be one of main factors for implementing high reliability.

In addition, at the time of mounting the multilayer ceramic electronic component on a board, a piezoelectric phenomenon may be generated between the internal electrodes, such that vibration sound may be generated. Since the vibration sound may have a frequency corresponding to an audio frequency in a region of 20 to 20,000 Hz making a person uncomfortable, there is a need to decrease vibration of the multilayer ceramic electronic component transferred to the board.

RELATED ART DOCUMENT (Patent Document 1) Korean Patent Laid-Open Publication No. 2012-0068622

SUMMARY

An aspect of the present disclosure may provide a multilayer ceramic electronic component and a method of manufacturing the same.

According to an aspect of the present disclosure, a multilayer ceramic electronic component may include: a ceramic body in which internal electrodes containing a first electrode material are disposed; external electrodes formed on outer surfaces of the ceramic body and containing a second electrode material; and diffusion parts connected to the internal electrodes and the external electrodes and including regions protruding outside of the ceramic body, whereby the multilayer ceramic electronic component may protect the ceramic body from external stress.

Hermetically sealed gaps may be formed between the outer surfaces of the ceramic body and the external electrodes due to the diffusion parts protruding outside of the ceramic body.

According to another aspect of the present disclosure, a method of manufacturing a multilayer ceramic electronic component may include: forming a ceramic body in which internal electrodes are disposed; applying an external electrode paste onto outer surfaces of the ceramic body to be connected to one ends of the internal electrodes; and forming external electrodes by sintering the external electrode paste while forming hermetically sealed gaps between the external electrodes and the ceramic body, whereby the ceramic body may be protected from external stress.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
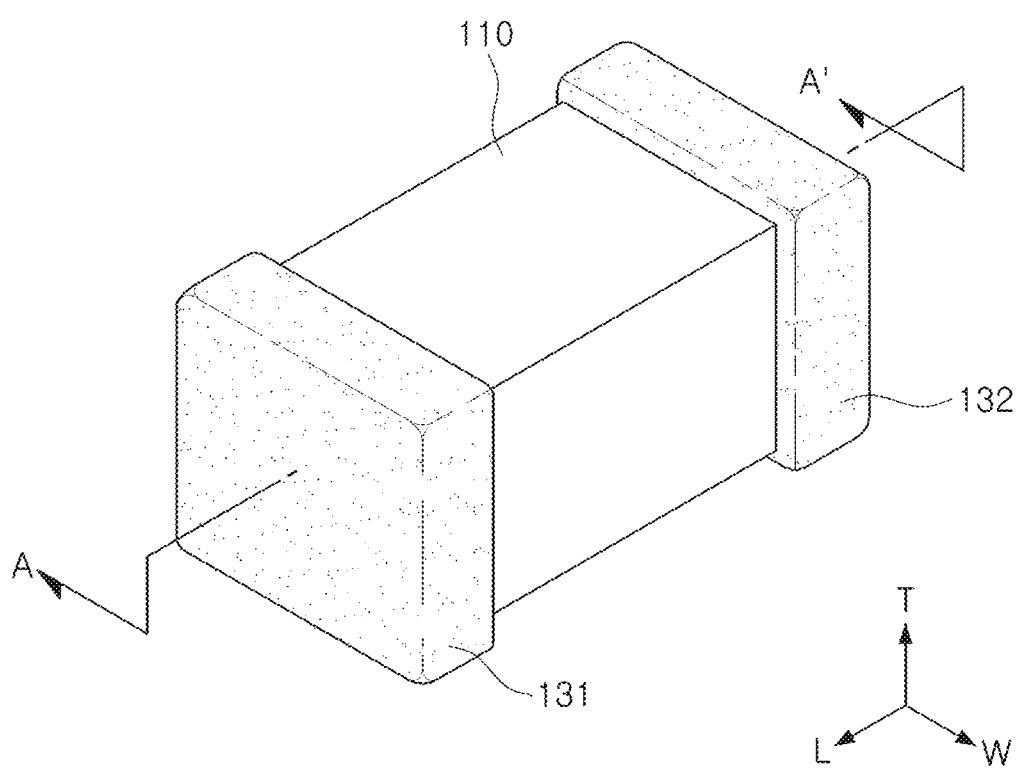
FIG. 1 is a perspective view showing a multilayer ceramic electronic component according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
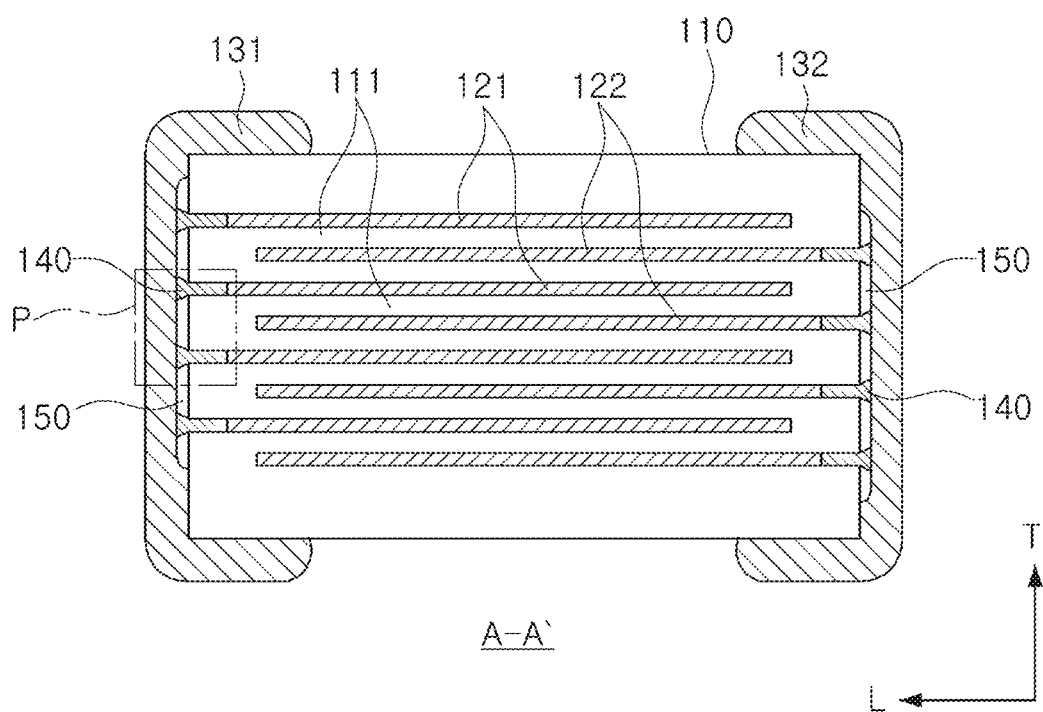
FIG. 2 is a cross-sectional view taken along line A-A' of FIG. 1.

FIG. 1 is a perspective view showing a multilayer ceramic electronic component 100 according to an exemplary embodiment of the present disclosure, and FIG. 2 is a cross-sectional view taken along line A-A' of FIG. 1.

Referring to FIGS. 1 and 2, the multilayer ceramic electronic component 100 according to an exemplary embodiment of the present disclosure may include a ceramic body 110; internal electrodes 121 and 122 disposed within the ceramic body; external electrodes 131 and 132 disposed on outer surfaces of the ceramic body; and diffusion parts 140 connecting the internal electrodes and the external electrodes to each other.

The ceramic body 110 may include an active layer as a portion contributing to forming capacitance of the electronic component and upper and lower cover layers formed on upper and lower portions of the active layer as upper and lower margin parts, respectively. The active layer may include dielectric layers 111 and the internal electrodes 121 and 122 and be formed by stacking the dielectric layers 111 on which the internal electrodes 121 and 122 are printed.

In an exemplary embodiment of the present disclosure, a shape of the ceramic body 110 is not particularly limited, but may be substantially a hexahedral shape. A difference in a thickness is generated according to the sintering shrinkage of ceramic powder at the time of sintering a chip and the presence or absence of an internal electrode pattern, and edge parts of the ceramic body are polished, such that the ceramic body 110 does not have a perfect hexahedral shape but may have a shape substantially close to a hexahedral shape.

Directions of the ceramic body will be defined in order to clearly describe exemplary embodiments of the present disclosure. L, W and T shown in the accompanying drawings refer to a length direction, a width direction, and a thickness direction, respectively. Here, the thickness direction may be the same as a stacking direction in which the dielectric layers are stacked.

The internal electrodes 121 and 122 may be alternately stacked with the dielectric layers 111 and electrically insulated from each other by the dielectric layer 111 interposed between the internal electrodes.

The internal electrodes 121 and 122 may include first and second internal electrodes 121 and 122.

The internal electrodes 121 and 122 may be electrically connected to the external electrodes 131 and 132 disposed on the outer surfaces of the ceramic body 110 through the diffusion parts 140. The external electrodes may include a first external electrode 131 and a second external electrode 132, the first internal electrodes 121 may be electrically connected to the first external electrode 131 through the diffusion parts 140, and the second internal electrodes 122 may be electrically connected to the second external electrode 132 through the diffusion parts 140, respectively.

A thickness and the number of stacked internal electrodes 121 and 122 may be determined depending on the use.

The internal electrodes 121 and 122 may contain a first electrode material, wherein the first electrode material may be nickel (Ni), copper (Cu), palladium (Pd), or an alloy thereof, but is not limited thereto.

The first electrode material may be nickel (Ni), but is not limited thereto.

A thickness of the dielectric layer 111 may be optionally changed depending on a capacitance design of the multilayer ceramic electronic component.

Further, the dielectric layer 111 may contain ceramic powder having high permittivity, for example, barium titanate ($BaTiO_3$) based powder or strontium titanate ($SrTiO_3$) based powder, but the present disclosure is not limited thereto.

The upper and lower cover layers may have the same material and configuration as those of the dielectric layer 111 except that internal electrodes are not included therein. The upper and lower cover layers may be formed by stacking a single or two or more dielectric layers on upper and lower surfaces of the active layer in a vertical direction, respectively, and may serve to prevent the internal electrodes 121 and 122 from being damaged by physical or chemical stress.

The external electrodes 131 and 132 may be connected to the internal electrodes 121 and 122 through the diffusion parts 140, thereby securing electric connection between the external electrodes and the internal electrodes.

The external electrodes 131 and 132 may contain a second electrode material, wherein the second electrode material may be nickel (Ni), copper (Cu), palladium (Pd), gold (Au), silver (Ag), or an alloy thereof, but the present disclosure is not limited thereto.

The second electrode material may be copper (Cu), but is not limited thereto.

Although not limited, the external electrodes 131 and 131 may further contain glass and be formed of an external electrode paste containing the second electrode material and the glass. The glass may be contained in the external electrode paste in a glass frit form.

The external electrodes may be sintering type electrodes formed by sintering the external electrode paste.

The diffusion parts 140 in which the first and second electrode materials are mixed may be disposed within connection regions between the internal electrodes 121 and 122 and the external electrodes 131 and 132. The diffusion parts 140 may be formed by a reaction of the first electrode material contained in the internal electrodes 121 and 122 and the second electrode material contained in the external electrodes 131 and 132 during a sintering process of the external electrodes, and the internal electrodes 121 and 122 and the external electrodes 131 and 132 may be connected to each other through the diffusion parts 140.

For example, nickel (Ni) as the first electrode material and copper (Cu) as the second electrode material react with each other to thereby be mixed with each other, such that the diffusion parts 140 may be formed.

Figure 3:
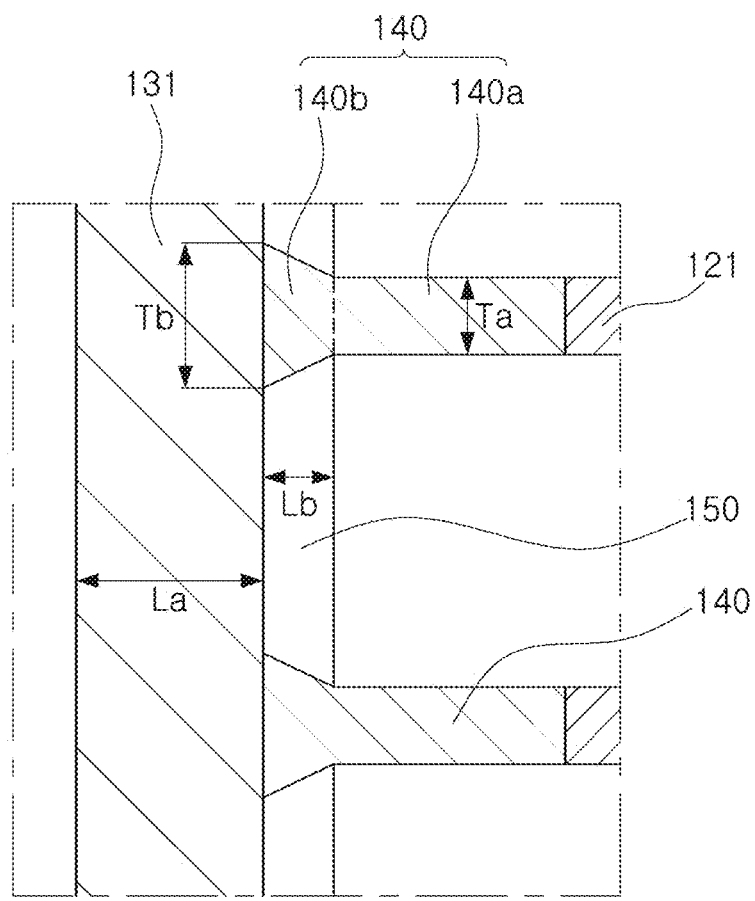
FIG. 3 is an enlarged view of part P of FIG. 2.
Figure 4:
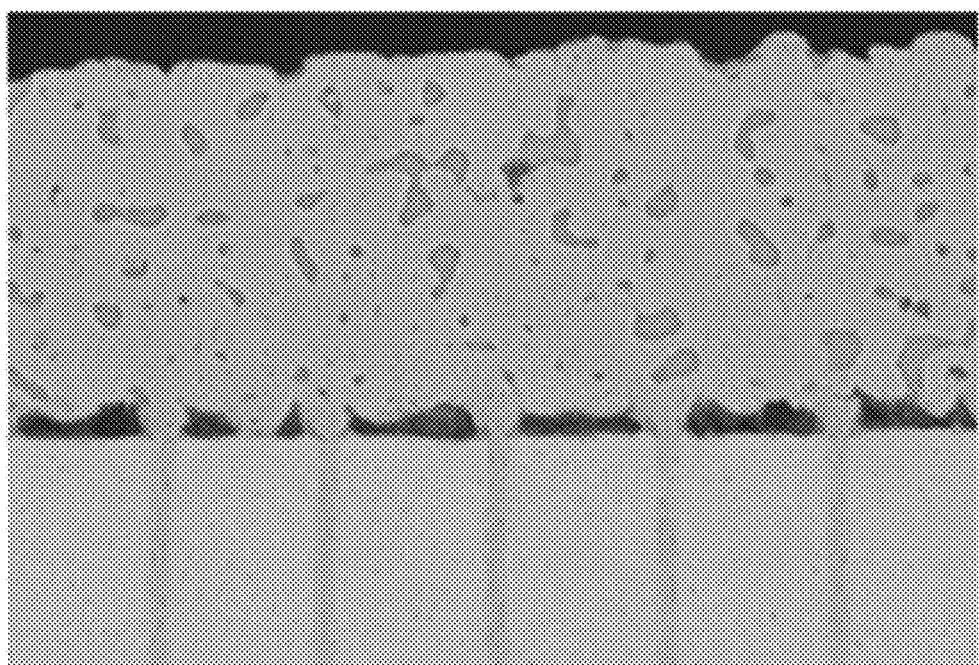
FIG. 4 is a scanning electronic microscope (SEM) photograph showing a cross section of a region in which a diffusion portion is formed in the multilayer ceramic electronic component according to an exemplary embodiment of the present disclosure and regions adjacent thereto.

FIG. 3 is an enlarged view of part P of FIG. 2, and FIG. 4 is a scanning electronic microscope (SEM) photograph showing a cross section of a region in which the diffusion portion is formed in the multilayer ceramic electronic component according to an exemplary embodiment of the present disclosure and regions adjacent thereto.

Hereinafter, a shape in which the diffusion parts 140 and the external electrodes 131 and 132 according to an exemplary embodiment of the present disclosure are disposed will be described in detail with reference to FIG. 3.

As shown in FIG. 3, in an exemplary embodiment of the present disclosure, the diffusion parts 140 may include internal diffusion portions 140a disposed within the ceramic body and external diffusion portions 140b protruding outwardly of the ceramic body.

For convenience of explanation, although boundaries of the internal electrodes 121 and 122, the diffusion parts 140, and the external electrodes 131 and 132 are exaggeratedly and clearly shown in FIG. 3, the boundaries are not clearly distinguished, but the internal electrodes 121 and 122, the diffusion parts 140, and the external electrodes 131 and 132 may be formed integrally with each other during the sintering process. In addition, the internal electrodes 121 and 122, the diffusion parts 140, and the external electrodes 131 and 132 may be distinguished from each other by a difference in ingredients thereof.

In the case in which the first electrode material contained in the internal electrodes 121 and 122 and the second electrode material contained in the external electrodes 131 and 132 react with each other to form the diffusion parts, a volume may be expanded. In this case, a thickness of the diffusion part 140 formed on the outer surface of the ceramic body 110 may be thicker than that of the diffusion part formed within the ceramic body 110 in which volume expansion is suppressed by dielectric layers 111 adjacent thereto.

For example, as shown in FIG. 3, when a thickness of the internal diffusion portion 140a is defined as Ta, and a thickness of the external diffusion portion 140b is defined as Tb, the diffusion parts 140 may satisfy Ta<Tb.

Here, the thicknesses of the internal and external diffusion portions 140a and 140b may be average thicknesses of the internal and external diffusion portions 140a and 140b measured, respectively, in a cross section of the multilayer ceramic electronic component 100 in a thickness-length direction.

According to an exemplary embodiment of the present disclosure, the external electrodes 131 and 132 are not entirely closely attached to the outer surface of the ceramic body 110 due to the diffusion part protruding outwardly of the ceramic body 110, that is, the external diffusion portion 140b, but may be formed to be spaced apart from the outer surface of the ceramic body at some region thereof.

For example, when among the surfaces of the external electrodes 131 and 132, surfaces adjacent to the ceramic body while facing the ceramic body are defined as inner surfaces, the inner surfaces of the external electrodes 131 and 132 may include regions in contact with the outer surface of the ceramic body 110 and regions spaced apart from the outer surface of the ceramic body 110.

According to an exemplary embodiment of the present disclosure, a gap 150 is disposed between the ceramic body and the external electrodes in spaced regions between the outer surface of the ceramic body 110 and the inner surfaces of the external electrodes 131 and 132.

The gap 150 may be formed in regions adjacent to the diffusion parts 140, and a width of the gap 150 may be larger than the thickness of the internal electrodes 121 and 122.

The width of the gap 150 refers to the longest straight line among virtual straight lines crossing the gap 150 in the cross section of the multilayer ceramic electronic component 100 in the thickness-length direction.

According to an exemplary embodiment of the present disclosure, since the ceramic body 110 and the external electrodes 131 and 132 are not entirely closely attached to each other but are partially spaced apart from each other to form the gap 150, external stress transferred to the ceramic body 110 through the external electrodes 131 and 132 may be decreased.

For example, external force generated due to a warpage phenomenon of a board, or the like, after mounting the multilayer ceramic electronic component on the board is transferred to the ceramic body 110 through the external electrodes 131 and 132, but in the case in which the gap 150 is formed between the ceramic body 110 and the external electrodes 131 and 132, the transferring of external force may be partially blocked in the gap 150, such that stress applied to the ceramic body 110 may be decreased.

Further, since the dielectric layers 111 of the multilayer ceramic electronic component 100 have piezoelectricity and electrostriction, when a direct current (DC) or alternate current (AC) voltage is applied to the multilayer ceramic electronic component 100, a piezoelectric phenomenon is generated between the internal electrodes 121 and 122, which causes vibration.

This vibration is transferred to the board on which the multilayer ceramic electronic component is mounted through solders connected to the external electrodes of the multilayer ceramic electronic component, such that the board becomes an acoustic reflective surface, thereby generating a vibration sound, which is noise.

The vibration sound may have a frequency corresponding to an audio frequency in a region of 20 to 20,000 Hz making a person uncomfortable. The vibration sound making the person uncomfortable as described above is called acoustic noise.

According to an exemplary embodiment of the present disclosure, the gap 150 is disposed within some regions between the ceramic body 110 and the external electrodes 131 and 132, such that the transferring of vibration generated by the piezoelectric phenomenon of the internal electrodes to the board through the external electrodes may be decreased, and accordingly, acoustic noise may be decreased.

According to an exemplary embodiment of the present disclosure, since the thickness of the external diffusion portion 140b is thicker than that of the internal diffusion portion 140a, even though the gap 150 is disposed within the region adjacent to the external diffusion portion 140b, connectivity between the internal electrodes 121 and 122 and the external electrodes 131 and 132 may be secured.

According to an exemplary embodiment of the present disclosure, even though the gap 150 may be partially formed between the external electrodes 131 and 132 and the ceramic body 110, in order to protect the internal electrodes 121 and 122 from physical or chemical stress, the external electrodes 131 and 132 may be formed so that the internal electrodes 121 and 122 and the diffusion parts 140 are hermetically sealed from the outside.

For example, the regions of the inner surfaces of the external electrodes 131 and 132 spaced apart from the outer surface of the ceramic body 110 may be disposed within regions of the inner surfaces of the external electrodes 131 and 132 in contact with the outer surface of the ceramic body 110, such that the gap 150 partially formed between the ceramic body 110 and the external electrodes 131 and 132 may be sealed from the outside.

Although not limited, according to an exemplary embodiment of the present disclosure, when the thickness of the internal diffusion portion 140a is defined as Ta and the thickness of the external diffusion portion 140b is defined as Tb, Ta and Tb may satisfy $1 \leq Tb/Ta \leq 3$.

In the case in which Tb/Ta is less than 1, it may be difficult to form the gap between peripheral portions of the internal electrodes and the external electrodes, and in the case in which Tb/Ta is more than 3, each of the diffusion parts may be connected to each other, such that formation of a suitable gap may become difficult.

Although not limited, according to an exemplary embodiment of the present disclosure, when a thickness of the external electrodes 131 and 132 is defined as La and a length of the external diffusion portion 140b is defined as Lb, La and Lb may satisfy $Lb/La \leq \frac{1}{2}$.

In the case in which Lb/La is more than ½, the gap may be excessively large, such that the multilayer ceramic electronic component may be easily damaged by external impact, or the like, and the diffusion part is enlarged, such that formation of a suitable gap may become difficult.

Although not shown, conductive resin layers containing conductive particles and an epoxy resin may be selectively disposed on the external electrodes 131 and 132.

Further, plating layers containing tin may be selectively formed on the external electrodes in order to improve adhesion with solders at the time of mounting the multilayer ceramic electronic component on the board.

For example, the conductive resin layers may be disposed on the external electrodes 131 and 132 and the plating layers may be formed on the conductive resin layers.

In the multilayer ceramic electronic component according to an exemplary embodiment of the present disclosure, the diffusion parts 140 connecting the external electrodes 131 and 132 and the internal electrodes 121 and 122 to each other include regions protruding outwardly of the ceramic body, such that the ceramic body 110 may be protected from stress applied from the outside, and at the time of mounting the multilayer ceramic electronic component on the board, acoustic noise may be decreased.

Figure 5:
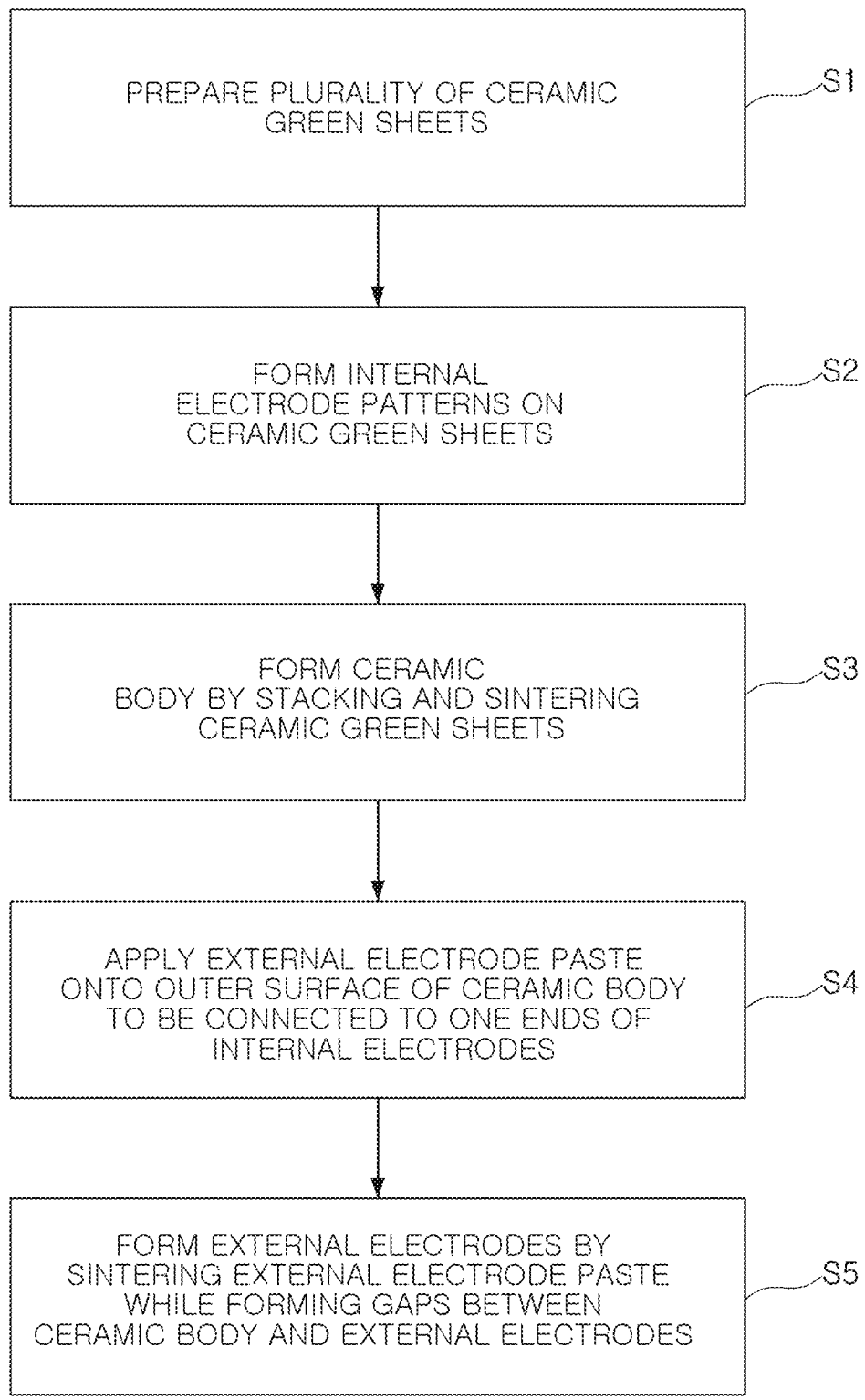
FIG. 5 is a flow chart showing a method of manufacturing a multilayer ceramic electronic component according to another exemplary embodiment of the present disclosure.

FIG. 5 is a flowchart showing a method of manufacturing a multilayer ceramic electronic component according to another exemplary embodiment of the present disclosure.

Referring to FIG. 5, a method of manufacturing a multilayer ceramic electronic component according to another exemplary embodiment of the present disclosure may include: preparing a plurality of ceramic green sheets (S1); forming an internal electrode pattern on the ceramic green sheets (S2); forming a ceramic body (S3); applying an external electrode paste onto an outer surface of the ceramic body (S4); and forming external electrodes (S5).

The preparing of the plurality of ceramic green sheets (S1) may be performed by applying and drying slurry containing dielectric powder onto a carrier film.

The forming of the internal electrode pattern (S2) may be performed by printing an internal electrode paste on the ceramic green sheets, but a method of forming the internal electrode pattern is not limited thereto.

The internal electrode paste may contain a first electrode material.

The first electrode material may be nickel (Ni), copper (Cu), palladium (Pd), or an alloy thereof, but is not limited thereto.

The forming of the ceramic body (S3) may be performed by stacking the ceramic green sheets on which the internal electrode pattern is formed and stacking the ceramic green sheets on which the internal electrode pattern is not formed on upper and lower portions of the stacked ceramic green sheets in order to form cover layers to forma ceramic multilayer body, and then sintering the ceramic multilayer body.

According to an exemplary embodiment of the present disclosure, the method of manufacturing a multilayer ceramic electronic component may further include, before the sintering of the multilayer body, pressing the multilayer body and cutting the pressed multilayer body into an individual chip form so that one ends of the internal electrode patterns are alternately exposed to cutting surfaces.

The applying of the external electrode paste onto the outer surface of the ceramic body (S4) may be performed using the external electrode paste. Application of the external electrode paste may be performed by dipping the ceramic body in the external electrode paste, but is not limited thereto.

According to an exemplary embodiment of the present disclosure, the external electrode paste may contain a second electrode material.

The second electrode material may be nickel (Ni), copper (Cu), palladium (Pd), gold (Au), silver (Ag), or an alloy thereof, but the present disclosure is not limited thereto.

Thereafter, the forming of the external electrodes (S5) may be performed by sintering the external electrode paste applied onto the ceramic body.

The forming of the external electrodes may be performed at a temperature higher than that in a general sintering process of external electrodes so that the second electrode material contained in the external electrode paste and the first electrode material contained in the internal electrode may react with each other to form diffusion portions connecting the internal electrodes and the external electrodes to each other and gaps formed between the ceramic body and the external electrodes.

For example, although not limited, the forming of the external electrodes may be performed at a temperature higher than a suitable sintering temperature of the external electrode paste so that the gap may be formed between the ceramic body and the external electrodes by the external diffusion portion protruding outwardly of the ceramic body. However, the forming of the external electrodes may be performed at a temperature within 120% of the suitable sintering temperature. The suitable sintering temperature is a general sintering temperature of the external electrode paste in order to allow gaps not to be formed between the ceramic body and the external electrode, and the sintering temperature of the external electrode paste may be changed depending on the kind of external electrode paste.

As set forth above, according to exemplary embodiments of the present disclosure, the multilayer ceramic electronic component capable of having excellent resistance against external stress and decreasing generation of acoustic noise at the time of mounting the multilayer ceramic electronic component on the board, and the method of manufacturing the same may be provided.

While exemplary embodiments have been shown and described above, it will be apparent to those skilled in the art that modifications and variations could be made without departing from the scope of the present invention as defined by the appended claims.

What is claimed is:

1. A multilayer ceramic electronic component comprising:
a ceramic body in which internal electrodes containing a first electrode material and dielectric layers are alternately disposed;
external electrodes provided on outer surfaces of the ceramic body and containing a second electrode material; and
diffusion parts each disposed to be connected to one end of the internal electrode and the external electrode and containing the first electrode material and the second electrode material mixed with each other,
wherein the diffusion part includes an internal diffusion portion disposed within the ceramic body and an external diffusion portion protruding outside of the ceramic body, and
wherein the outer surface of the ceramic body and the external electrode have a hermetically sealed gap therebetween.

2. The multilayer ceramic electronic component of claim 1, wherein the gap is present in a region adjacent to the diffusion part.

3. The multilayer ceramic electronic component of claim 1, wherein a width of the gap is greater than a thickness of the internal electrode.

4. The multilayer ceramic electronic component of claim 1, wherein an inner surface of the external electrode adjacent to the outer surface of the ceramic body include regions in contact with the outer surface of the ceramic body and a region spaced apart from the outer surface of the ceramic body.

5. The multilayer ceramic electronic component of claim 4, wherein the region of the inner surface of the external electrode which is spaced apart from the outer surface of the ceramic body is disposed within the regions thereof in contact with the outer surface of the ceramic body.

6. The multilayer ceramic electronic component of claim 1, wherein the external diffusion portion is thicker than the internal diffusion portion.

7. The multilayer ceramic electronic component of claim 1, wherein when a thickness of the internal diffusion portion is defined as Ta and a thickness of the external diffusion portion is defined as Tb, $1 \leq Tb/Ta \leq 3$ is satisfied.

8. The multilayer ceramic electronic component of claim 1, wherein when a thickness of the external electrode is defined as La and a length of the external diffusion portion is defined as Lb, Lb/La≤½ is satisfied.

9. A multilayer ceramic electronic component comprising:
a ceramic body in which internal electrodes containing a first electrode material and dielectric layers are alternately disposed;
external electrodes containing a second electrode material and provided on outer surfaces of the ceramic body while having a hermetically sealed gap therebetween; and
diffusion parts each disposed to be connected to one end of the internal electrode and the external electrode and containing the first electrode material and the second electrode material mixed with each other.

10. The multilayer ceramic electronic component of claim 9, wherein the gap is present in a region adjacent to the diffusion part.

11. The multilayer ceramic electronic component of claim 9, wherein a width of the gap is greater than a thickness of the internal electrode.

12. The multilayer ceramic electronic component of claim 9, wherein the diffusion part includes an internal diffusion portion disposed within the ceramic body and an external diffusion portion protruding outside of the ceramic body.

13. The multilayer ceramic electronic component of claim 9, wherein the diffusion part includes an internal diffusion portion disposed within the ceramic body and an external diffusion portion thicker than the internal diffusion portion.

14. The multilayer ceramic electronic component of claim 13, wherein when a thickness of the internal diffusion portion is defined as Ta and a thickness of the external diffusion portion is defined as Tb, 1≤Tb/Ta≤3 is satisfied.

15. The multilayer ceramic electronic component of claim 13, wherein when a thickness of the external electrode is defined as La and a length of the external diffusion portion is defined as Lb, Lb/La≤½ is satisfied.

16. A method of manufacturing a multilayer ceramic electronic component, the method comprising:
preparing a plurality of ceramic green sheets;
forming internal electrode patterns on the ceramic green sheets;
stacking and sintering the ceramic green sheets to form a ceramic body in which internal electrodes containing a first electrode material and dielectric layers are alternately disposed;
applying an external electrode paste onto outer surfaces of the ceramic body to be connected to one ends of the internal electrodes; and
sintering the external electrode paste to form external electrodes while forming hermetically sealed gaps between the ceramic body and the external electrodes.

17. The method of claim 16, wherein the forming of the external electrodes includes forming diffusion parts connecting the internal electrodes and the external electrodes and including regions protruding outside of the ceramic body.

* * * * *